(12) United States Patent
Su

(10) Patent No.: US 10,285,288 B1
(45) Date of Patent: May 7, 2019

(54) ELECTRONIC DEVICE WITH ANTI-DISASSEMBLY STRUCTURE

(71) Applicant: NANNING FUGUI PRECISION INDUSTRIAL CO., LTD., Nanning (CN)

(72) Inventor: Feng-Ching Su, New Taipei (TW)

(73) Assignee: NANNING FUGUI PRECISION INDUSTRIAL CO., LTD., Nanning (CN)

(*) Notice: Subject to any disclaimer, the term of this patent is extended or adjusted under 35 U.S.C. 154(b) by 0 days.

(21) Appl. No.: 16/018,154

(22) Filed: Jun. 26, 2018

(51) Int. Cl.
*H05K 5/02* (2006.01)
*H05K 5/03* (2006.01)

(52) U.S. Cl.
CPC ......... *H05K 5/0208* (2013.01); *H05K 5/0221* (2013.01); *H05K 5/0252* (2013.01); *H05K 5/03* (2013.01)

(58) Field of Classification Search
CPC .. H05K 5/0208; H05K 5/0221; H05K 5/0252; H05K 5/03
See application file for complete search history.

(56) References Cited

U.S. PATENT DOCUMENTS

| 9,086,852 | B2* | 7/2015 | Johnson | G06F 1/1662 |
| 9,461,390 | B2* | 10/2016 | Blum | F16B 35/005 |
| 2008/0007902 | A1* | 1/2008 | Kim | G06F 1/1616 |
| | | | | 361/679.08 |

FOREIGN PATENT DOCUMENTS

| CN | 202056180 U | 11/2011 |
| CN | 202828422 U | 3/2013 |

* cited by examiner

*Primary Examiner* — Adrian S Wilson
(74) *Attorney, Agent, or Firm* — ScienBiziP, P.C.

(57) ABSTRACT

An electronic device with anti-disassembly structure includes a top cover having a first set of serrated teeth and a first through hole, a fastener receiver having a posting head and a posting body, a fixed disk having a fourth set of serrated teeth, an elastic member, a bottom cover having a second through hole, and a fastener. The posting head has a second set of serrated teeth and a third set of serrated teeth. When the top cover is separated from the bottom cover, the elastic member is compressed by the external force, and the second set of serrated teeth is separated with the first set of serrated teeth, the third set of serrated teeth engage with the fourth set of serrated teeth, and the fastener is rotated to detached from the bottom cover.

8 Claims, 9 Drawing Sheets

ELECTRONIC DEVICE WITH ANTI-DISASSEMBLY STRUCTURE

FIELD

The subject matter herein generally relates to an anti-disassembly structure, and more particularly to electronic device with the same.

BACKGROUND

To prevent disassembly of electronic products, the electronic products may use a security sticker and an anti-disassembly disassembly structure in combination to judge whether the electronic products have been taken apart or not. Users taking apart the electronic products need to destroy the security sticker. The anti-disassembly structure usually uses special fastener structures that make disassembly difficult absent special tools. The special tools are needed for assembly and maintenance of products because of special fastener. This anti-disassembly structure makes it easy for everyone to find a way of disassembly.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
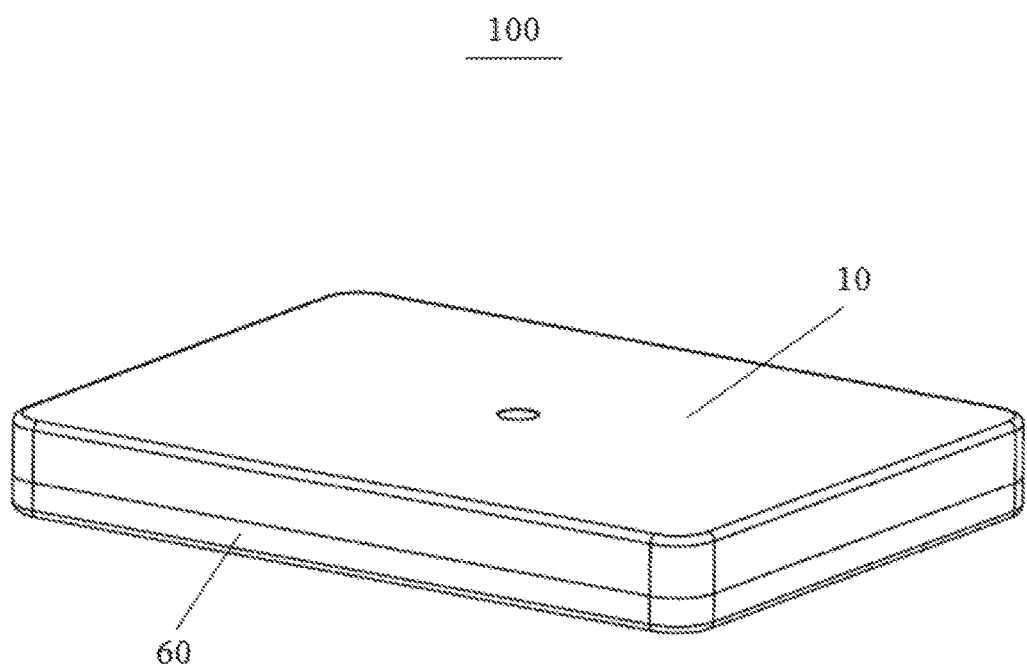
FIG. 1 is an isometric view of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of example and not by way of limitation in the figures of the accompanying drawings in which like reference numerals indicate the same or similar elements. It should be noted that references to "an" or "one" embodiment in this disclosure are not necessarily to the same embodiment, and such references can mean "at least one".

Figure 2:
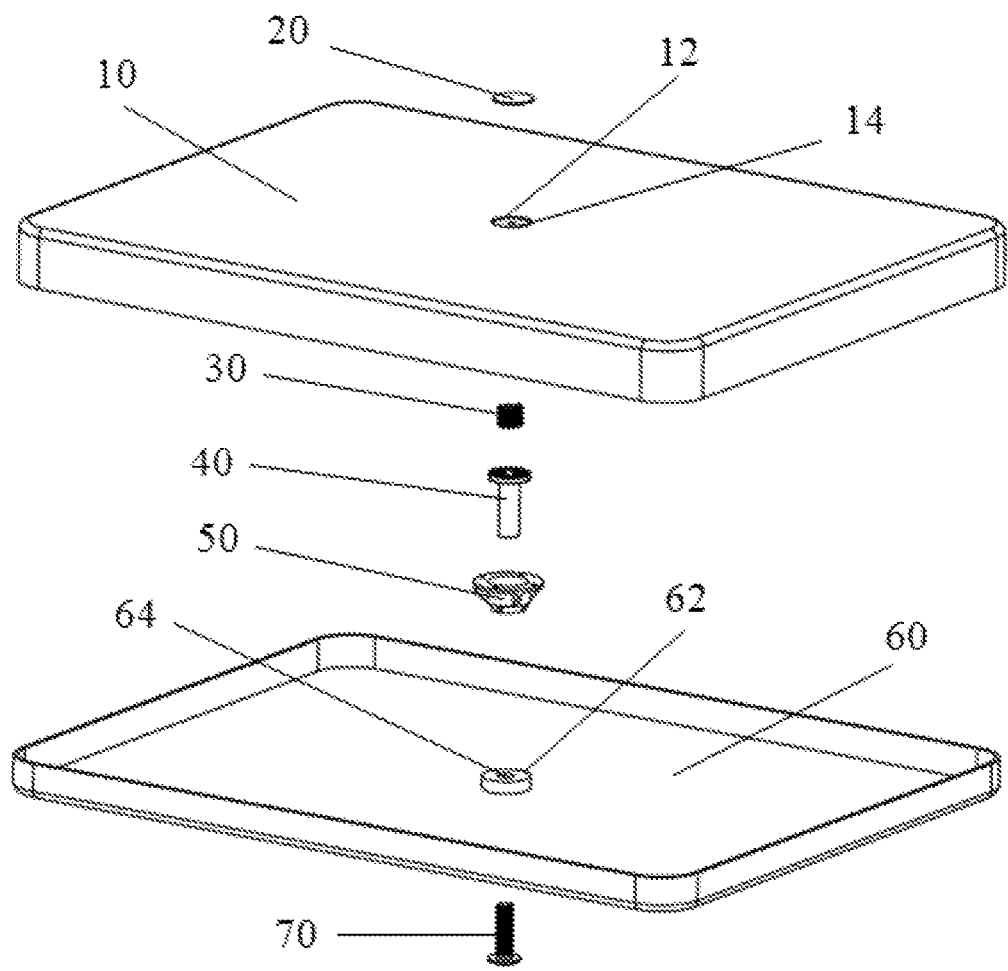
FIG. 2 is an exploded view of the electronic device shown in FIG. 1.

Referring to FIGS. 1 and 2, an embodiment of an electronic device includes a top cover 10, a security label 20, an elastic member 30, a fastener receiver 40, a fixed disk 50, a bottom cover 60 and a fastener 70. The elastic member 30, the fastener receiver 40 and the fixed disk 50 are received in a space defined by the top cover 10 and the bottom cover 60. The top cover 10 includes a groove 12 and a first through hole 14. The groove 12 is in communication with the first through hole 14. The security label 20 is embedded into the groove 12 of the top cover 10. The bottom cover 60 includes a flange 62 and a second through hole 64. The fastener 70 passes through the second through hole 64 to mount the top cover 10 and the bottom cover 60. The security label 20 maybe a mylar or an inscription board with decorative and easily broken. The security label 20 is attached on the top cover 10 and is easy to be removed and damaged.

Figure 3:
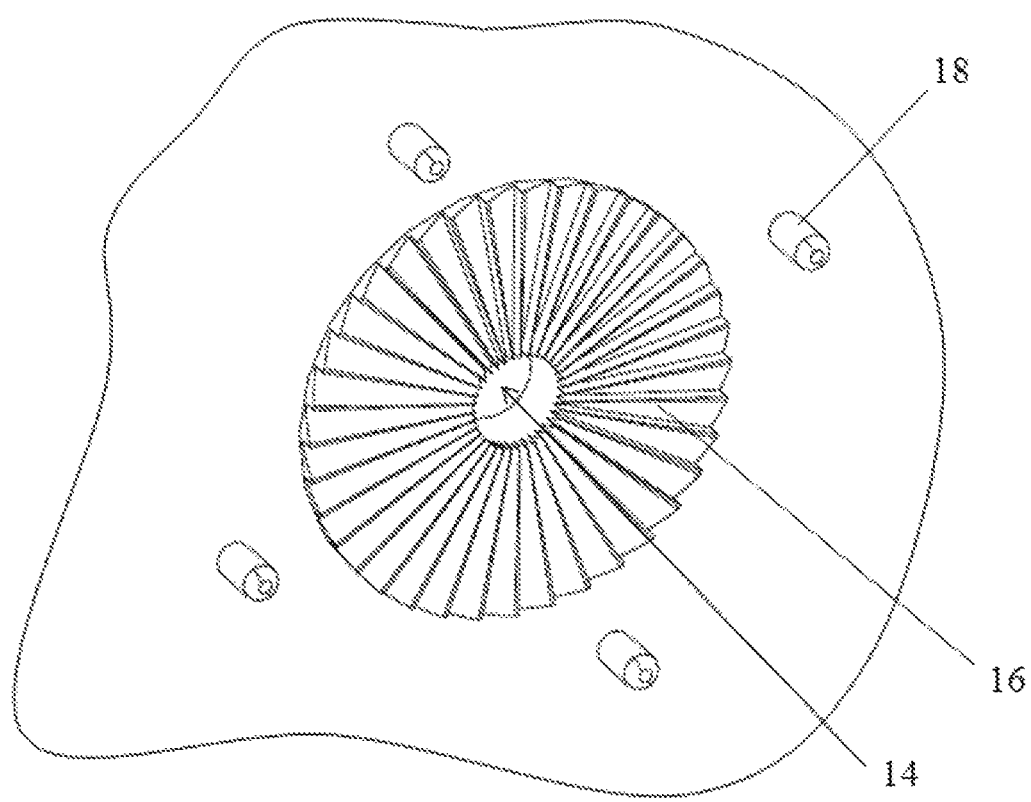
FIG. 3 is a partially isometric view of a top cover of the electronic device shown in FIG. 1.

Referring to FIG. 3, the top cover 10 has a first set of serrated teeth 16 surrounded with first through hole 14 and a positioning post 18 surrounded with the first set of serrated teeth 16. In an embodiment, there are four positioning posts, and distributed on a periphery of the first set of serrated teeth 16.

Figure 4:
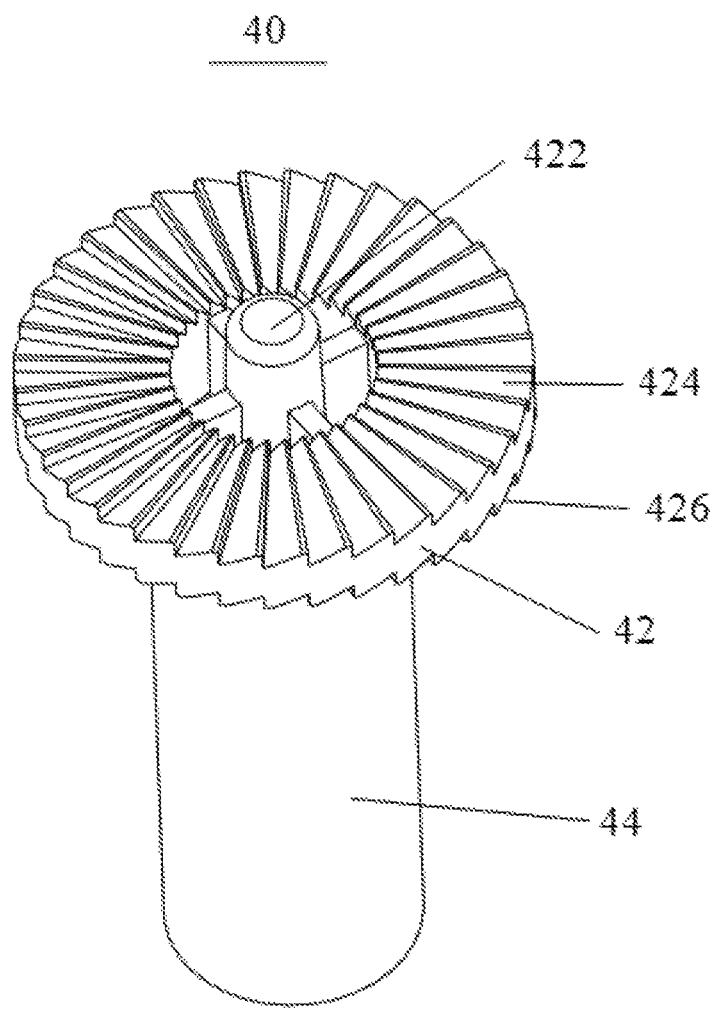
FIG. 4 is an isometric view of a fastener receiver of the electronic device shown in FIG. 1.
Figure 5:
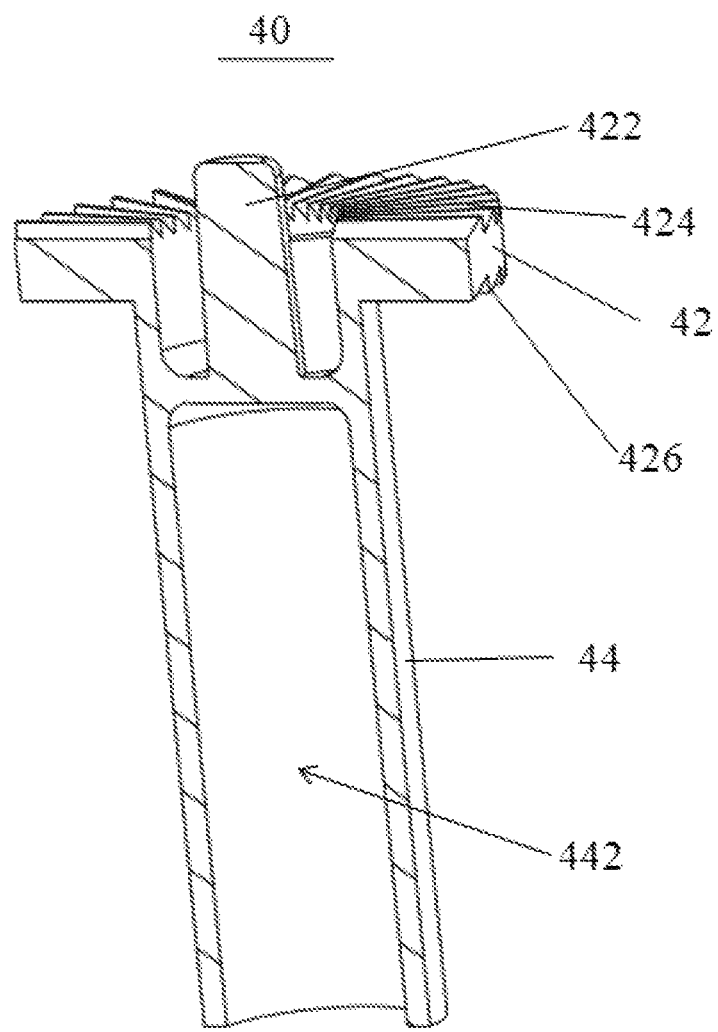
FIG. 5 is a cross-sectional view of a fastener receiver of the electronic device shown in FIG. 1.

Referring to FIGS. 4 and 5, the fastener receiver 40 includes a posting head 42 and a posting body 44. The posting head 42 has a protruding post 422, a second set of serrated teeth 424 surrounded with the protruding post 422 and a third set of serrated teeth 426 locates relative to the second set of serrated teeth 424. The posting body 44 defines a blind hole 442.

Figure 6:
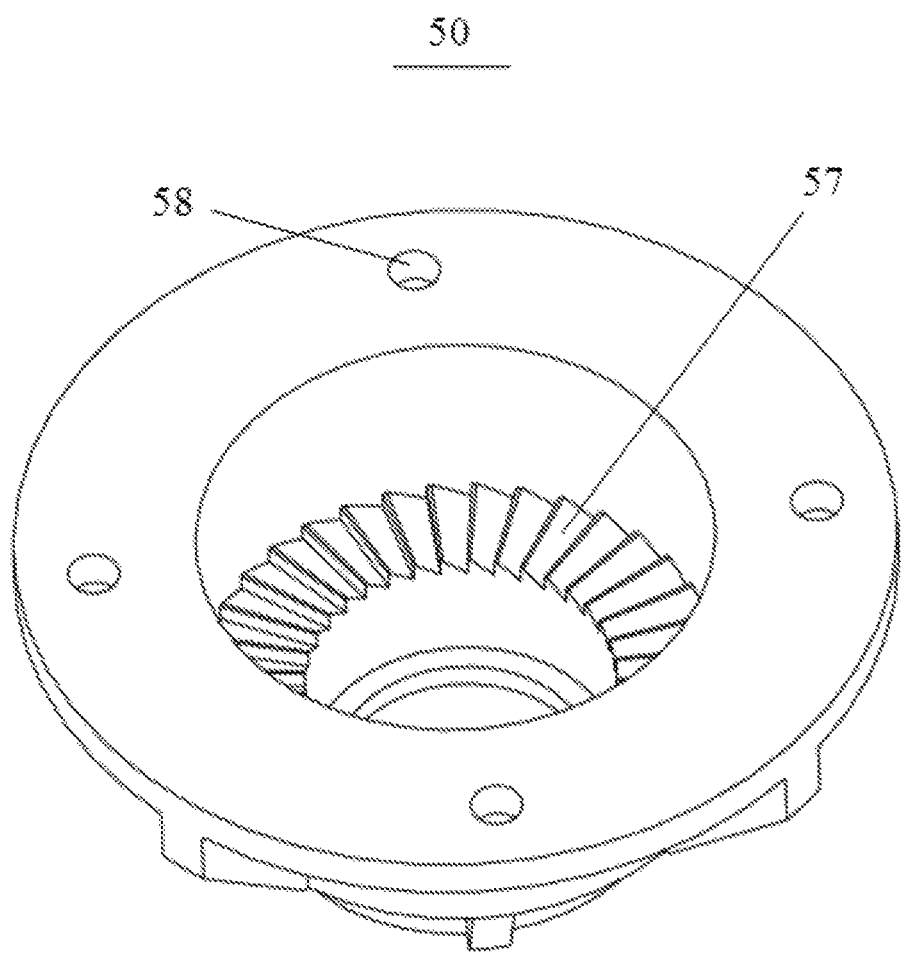
FIG. 6 is an isometric view of a fixed disk of the electronic device shown in FIG. 1.
Figure 7:
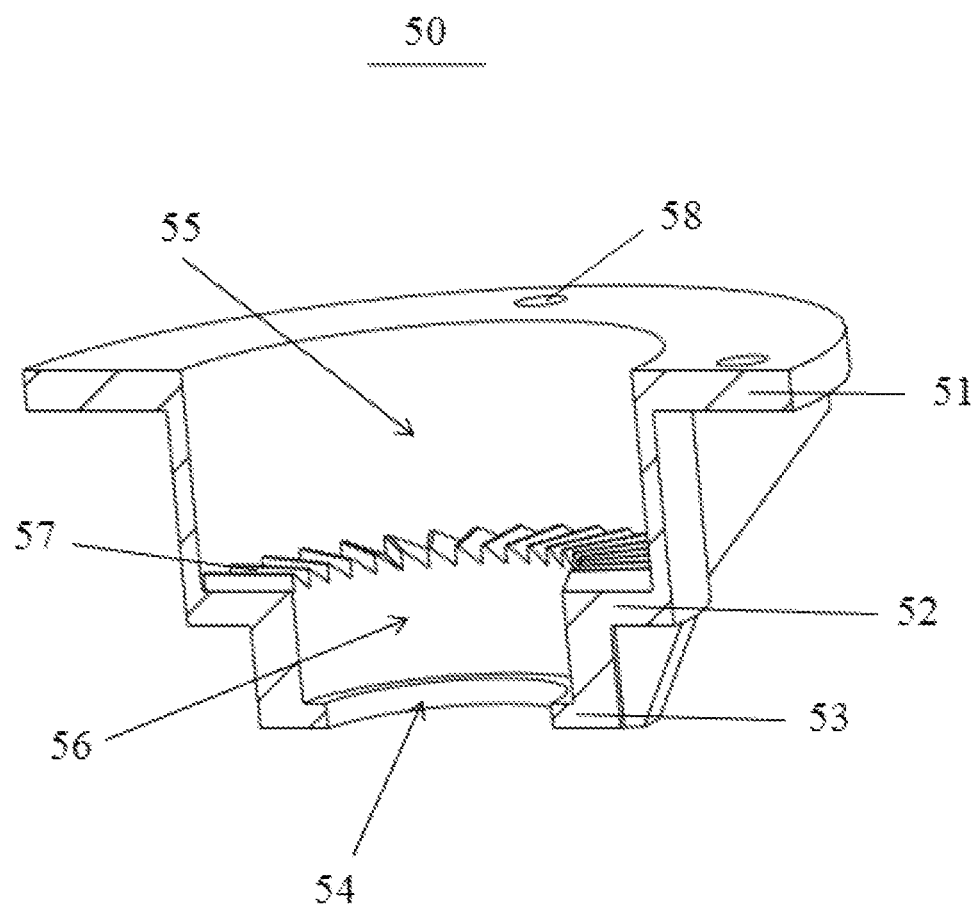
FIG. 7 is a cross-sectional view of a fixed disk of the electronic device shown in FIG. 1.

Referring to FIGS. 6 and 7, the fixed disk 50 includes a first stepped surface 51, a second stepped surface 52, a third stepped surface 53 and a third through hole 54. The first stepped surface 51 and the second stepped surface 52 defines a first receiving space 55. The second stepped surface 52 and the third stepped surface 53 defines a second receiving space 56. The second receiving space 56 is in communication with the third through hole 58. The second stepped surface 52 has a fourth set of serrated teeth 57. The first stepped surface 51 defines a positioning hole 58. A number of the positioning holes 58 is equal to a number of the positioning posts 18.

Figure 8:
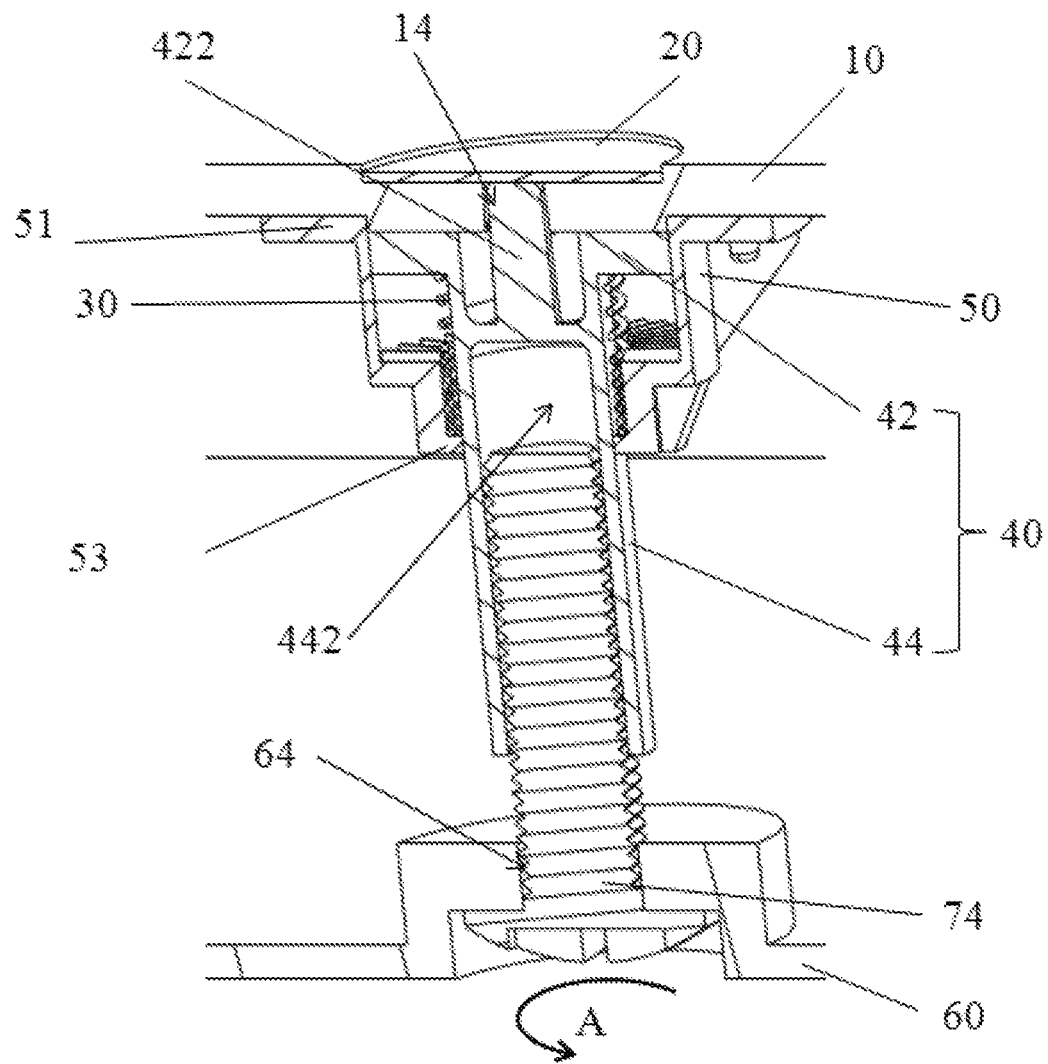
FIG. 8 is a cross-sectional view of an assembled structure of the electronic device shown in FIG. 1.

Referring to FIGS. 5, 7 and 8, when the electronic device 100 is assembled, the elastic member 30 is coiled around the posting body 44. The fastener receiver 40 with the elastic member 30 inserts into the fixed disk 50, one end of the elastic member 30 resists with the third stepped surface 53 of the fixed disk 50, and another end of the elastic member 30 resists with the posting head 42 of the fastener receiver.

The protruding post 422 of the posting head 42 passes through the first through hole 14 of the top cover 10. The fixed disk 50 defines a positioning hole 58 for the position post 18 passed through. The first stepped portion 51 of the fixed disk 50 resists an inner surface of the top cover 10, and the security label 20 is embedded into the groove 12 to hide the fastener receiver 40.

The fastener 70 passes through the second through hole 64 of the bottom cover 60 and is threadedly engaged inside the blind hole 442. The elastic member 30 resists with the fastener receiver 40 with elastic force, and the second set of serrated teeth 424 of the fastener receiver 40 engage with the first set of serrated teeth 16 of the top cover 10. Because the set of serrated teeth are directional, the second set of serrated teeth 424 engage with the first set of serrated teeth 16 in one direction and are not engaged with the first set of serrated teeth 16 in the opposite direction.

In an embodiment, in detail, when the fastener 70 is rotated clockwise, the first set of serrated teeth 16 engage with the second set of serrated teeth 424, the fastener 70 is rotated into the blind hole 442 of the posting body 44. When the fastener 70 is rotated counterclockwise, the first set of serrated teeth 16 is not engaged with the second set of serrated teeth 424, and the fastener 70 rotates with the fastener receiver 40. In this condition, the fastener 70 is not rotated relative to the fastener receiver 40, and it is impossible for the fastener 70 to be loosened from the fastener receiver 40. That is to say, in normal, the fastener 70 is only gradually locked up with the fastener receiver 40, and cannot be loosened.

Figure 9:
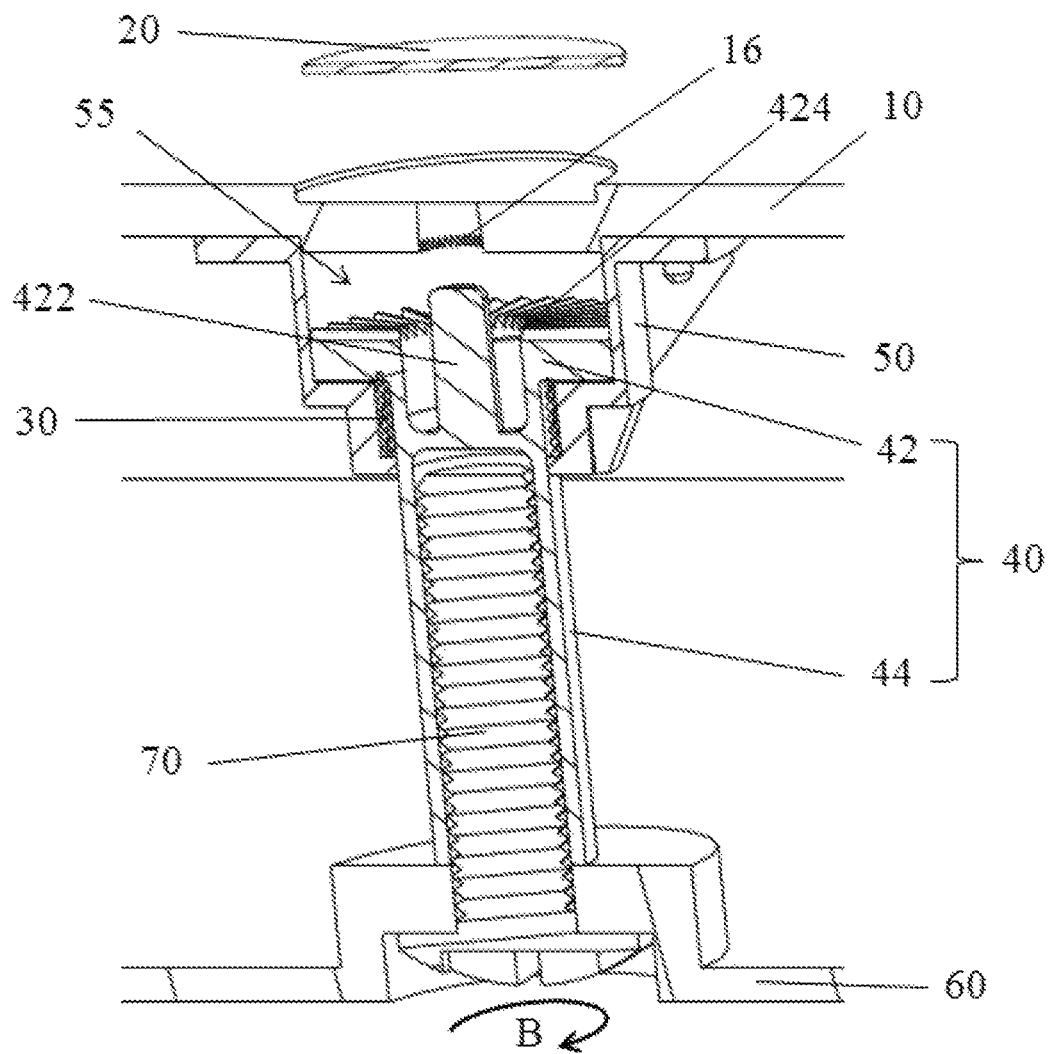
FIG. 9 is a cross-sectional view of an disassembled structure of the electronic device shown in FIG. 1.

Referring to FIGS. 5, 7 and 9, when the electronic device 100 is disassembled, the top cover 10 is separated from the bottom cover 60. The security label 20 needs to be torn off, and a bar-shaped tool produced to apply an external force on the protruding post 422. The elastic member 30 is compressed by the bar-shaped tool. The posting head 42 moves downward in the first receiving space 55, and the first set of serrated teeth 16 is separated from the second set of serrated teeth 424. The posting head 42 moves downward continuously until the third set of serrated teeth 426 of the fastener receiver 40 engage with the fourth set of serrated teeth 57 of the fixed disk 50.

The external force produced by the bar-shaped tool still works on the protruding post 422, in the same time, the fastener 70 is rotated in counterclockwise, and the fastener 70 is rotated relative to the fastener receiver 40, and finally released from the fastener receiver 40. The top cover 10 is separated from the bottom cover 60 after the fastener 70 released from the fastener receiver 40.

The electronic device with anti-disassembly structure is easy to assemble by rotating the fastener into the fastener receiver. When electronic device with anti-disassembly structure is disassembled, it is inevitable to tear off the security label, and then press the fastener receiver to have the set of serrated teeth of the fastener receiver and the fixed disk engaged together to be loosened the fastener. It is effectively reducing the chance the electronic device is disassembled by a users, or allows an operator to easily judge whether the electronic device has been disassembled or not. On one hand, the electronic device with anti-disassembly structure is easy to assemble yet difficult to disassemble while, on the other hand, an operator can easily determine whether the electronic device was disassembled or not through the security label design.

The embodiments shown and described above are only examples. Many details are often found in the art such as the features of electronic device with anti-disassembly structure. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An electronic device with anti-disassembly structure, comprising:
    a top cover having a first set of serrated teeth and a first through hole;
    a fastener receiver comprising a posting head and a posting body, the posting head having a second set of serrated teeth and a third set of serrated teeth;
    a fixed disk having a fourth set of serrated teeth;
    an elastic member coiled around the posting body and positioned between the posting head and the fixed disk;
    a bottom cover having a second through hole; and
    a fastener, wherein the elastic member resists with the fastener receiver to make the second set of serrated teeth engage with the first set of serrated teeth, the fastener passes through the second through hole and is rotated into the posting body to lock with the top cover, and when the top cover is separated from the bottom cover, an external force works on the fastener receiver, the elastic member is compressed by the external force, and the second set of serrated teeth is separated from the first set of serrated teeth, the third set of serrated teeth engage with the fourth set of serrated teeth, and the fastener is rotated to detached from the bottom cover.

2. The electronic device with anti-disassembly structure of claim 1, further comprising a security label, wherein the top cover further comprises a groove in communication with the first through hole, and the security label is embedded into the groove to hide the fastener receiver.

3. The electronic device with anti-disassembly structure of claim 1, wherein the posting head further comprises a protruding post to pass through the first through hole, the posting body defines a blind hole, and the fastener is threadedly engaged inside the blind hole.

4. The electronic device with anti-disassembly structure of claim 1, wherein the fixed disk comprises a first stepped surface, a second stepped surface, a third stepped surface and a third through hole, the first stepped surface and the second stepped surface defines a first receiving space, the second stepped surface and the third stepped surface defines a second receiving space, and the second receiving space is in communication with the third through hole.

5. The electronic device with anti-disassembly structure of claim 1, wherein the top cover has a positioning post surrounded with the first set of serrated teeth, the fixed disk defines a positioning hole for the position post passed through.

6. The electronic device with anti-disassembly structure of claim 4, wherein the posting head moves in the first receiving space, the first stepped surface matches with the top cover, and one end of the elastic member contacts with the third stepped surface.

7. The electronic device with anti-disassembly structure of claim 4, wherein the fourth set of serrated teeth is on the second stepped surface for matching with the third set of serrated teeth.

8. The electronic device with anti-disassembly structure of claim 1, wherein the bottom cover has a flange, the second through hole penetrates through the flange, and the flange resists with the posting body.

* * * * *